United States Patent

Oguro

[11] Patent Number: 6,074,478
[45] Date of Patent: Jun. 13, 2000

[54] METHOD OF FACET FREE SELECTIVE SILICON EPITAXY

[75] Inventor: Shizuo Oguro, Tokyo, Japan

[73] Assignee: NEC Corporation, Tokyo, Japan

[21] Appl. No.: 09/006,880

[22] Filed: Jan. 14, 1998

[30] Foreign Application Priority Data

Jan. 24, 1997 [JP] Japan .................................. 9-011069

[51] Int. Cl.$^7$ .......................... C30B 29/06; C30B 23/02
[52] U.S. Cl. ............................ 117/95; 117/97; 117/935
[58] Field of Search ........................... 117/95, 97, 935

[56] References Cited

U.S. PATENT DOCUMENTS

| | | | |
|---|---|---|---|
| 4,462,847 | 7/1984 | Thompson et al. | 438/353 |
| 4,547,231 | 10/1985 | Hine | 117/95 |
| 4,579,621 | 4/1986 | Hine | 117/95 |
| 4,698,316 | 10/1987 | Corboy, Jr. et al. | 117/102 |
| 5,166,767 | 11/1992 | Kapoor et al. | 257/518 |
| 5,168,089 | 12/1992 | Feygenson et al. | 117/88 |
| 5,242,530 | 9/1993 | Batey et al. | 117/90 |
| 5,409,543 | 4/1995 | Panitz et al. | 134/2 |
| 5,861,059 | 1/1999 | Suzuki | 117/97 |

FOREIGN PATENT DOCUMENTS 4-74415  3/1992  Japan .

*Primary Examiner*—Benjamin L. Utech
*Assistant Examiner*—Donald L. Champagne
*Attorney, Agent, or Firm*—Sughrue, Mion, Zinn, Macpeak & Seas, PLLC

[57] ABSTRACT

A flat selective silicon epitaxial thin film in which facet formation and loading effect are suppressed is grown by using a conventional LPCVD system which does not require an ultrahigh vacuum environment. Raw material gases for film formation and atomic hydrogen formed in an atomic hydrogen formation chamber 2 installed separately from a reaction chamber is introduced into the reaction chamber, at a growth temperature in the range of 750–900° C. and under a reaction chamber pressure in the range of 1–30 Torr.

8 Claims, 3 Drawing Sheets

FIG.3(a)　　　　FIG.3(b)
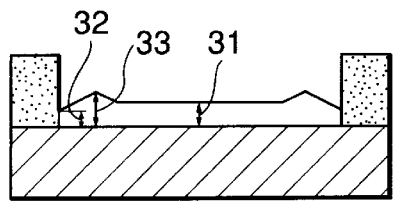 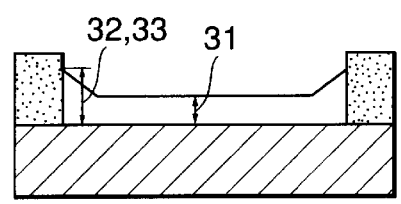
FIG.4
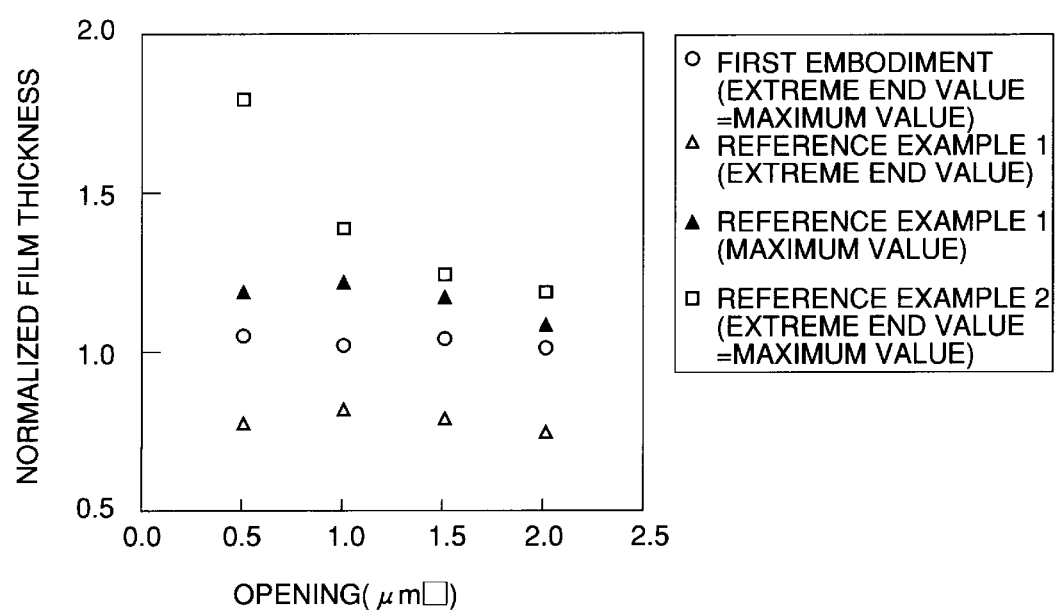

METHOD OF FACET FREE SELECTIVE SILICON EPITAXY

BACKGROUND OF THE INVENTION

1. Field of the Invention

The present invention relates to a method of manufacturing a semiconductor thin film, and more particularly, to a method of forming a selective silicon epitaxial film.

2. Description of the Related Art

Accompanying the advances in the integration level of the semiconductor devices, refinement of the device dimensions has been in progress. In the refinement of the insulated gate field effect transistors (MOS transistors), it has been recognized that the short channel effect is a matter of concern. As a method of suppressing the short channel effect, a technique of reducing the depth of the source/drain diffused layer of the transistor has been conceived. Since, however, the method of mere reduction of the depth of the diffused layer brings about such problems as an increase in the sheet resistivity and an increase in the resistance at the contact part with the wiring material, there is proposed a method by which the region of formation of the source/drain diffused layer is elevated with a selective silicon epitaxial film. According to this method, it is possible to achieve simultaneously the formation of a shallow diffused layer and a reduction of resistance.

Now, in conventional selective epitaxy, regions of small film thickness where crystal planes with certain orientations, called facets, tend to be formed in the end parts (parts where the grown film makes contact with an insulating film) of the grown film. When these facets are formed, the depth of a diffused layer under such a facet region becomes large, making it difficult to form a shallow junction.

The cause of the formation of a facet is the difference in the surface energy which depends on the orientation of the crystal plane. The surface energy of silicon differs with the orientation of the crystal plane, for example, the (100) plane has a surface energy higher than those of the (111) plane and the (311) plane. Accordingly, on the silicon substrate of the (100) plane, epitaxial growth proceeds with the formation not only of the (100) plane but also of the (111) and (311) planes that have lower surface energies.

With this in mind, a method of growing a selective silicon epitaxial film without accompanying formation of facets is disclosed in Publication of Unexamined Patent Applications No. Hei 4-074415 and others.

According to Publication of Unexamined Patent Application No. Hei 4-074415, it is possible to form a facet-free selective silicon epitaxial film under an high vacuum of less than $10^{-3}$ Torr by lowering the growth temperature and increasing the supply amounts of the raw material gas for film formation. The ranges of the growth temperature and the flow rate of the raw material gas is such that at a growth temperature of below 550° C., the flow rate of disilane ($Si_2H_6$) is more than about 5 sccm. At 700° C., it is more than about 50 sccm.

In addition, another method is known by which a desired silicon epitaxial film can be formed under a high vacuum of $1.5 \times 10^{-4}$ Torr. Namely, in this method, a selective silicon epitaxial film almost free from facets can be formed even at a growth temperature as high as 700° C. with a $Si_2H_6$ flow rate of 1 sccm, by introducing atomic hydrogen obtained by letting hydrogen ($H_2$) gas pass by filaments heated to a high temperature, along with the raw material gas $Si_2H_6$ for film formation. In this case, a reaction chamber capable of maintaining ultra-high vacuum is required in order to produce and utilize atomic hydrogen.

However, according to the method in Publication of Unexamined Patent Application No. Hei 4-074415, for growth at a low temperature or high flow rate of $Si_2H_6$, the film thickness for which the growth selectivity can be maintained becomes small so that it is difficult to apply the method to the manufacture of the actual device.

In the method of using atomic hydrogen, while it is possible to increase the thickness of the selectively grown film, the pressure during the growth has to be set at a high vacuum of less than about $1.5 \times 10^{-4}$ Torr. Therefore, a CVD system for ultra-high vacuum (UHV-CVD system) with reachable degree of vacuum in the growth chamber on the order of $10^{-9}$ Torr is employed. The necessity for the use of an ultrahigh vacuum for the growth system applies also to Publication of Unexamined Patent Application No. Hei 4-074415.

The UHV-CVD system requires a constitution which minimizes the leakage in order to maintain its ultrahigh vacuum, and is very expensive compared with the low pressure (LP) CVD system which is in wide general use. Moreover, the work required for maintaining the ultrahigh vacuum is also more intricate compared with the case in the LPCVD system, and its productivity is deteriorated accordingly.

In view of the productivity and maintainability, selective silicon epitaxial growth by means of an LPCVD system rather than by a UHV-CVD system is desirable.

Now, in the selective growth by an LPCVD system, hydrogen chloride (HCl), in addition to dichlorosilane ($SiH_2Cl_2$), the raw material gas for film formation, is used in order to obtain the required selectivity. Because of this, a tendency of generating changes in the growth rate depending on the size of the growth region and its density, the so-called loading effect, is conspicuous. The loading effect manifests itself when the growth pressure is high, so it is of no concern in the UHV-CVD system. In the LPCVD system on the other hand, formation of facets becomes a major problem when the growth pressure is lowered. Thus, in conventional LPCVD, the conditions which make selective silicon epitaxial growth possible through suppression of both of the loading effect and the facet formation, is extremely narrow compared with the case of growth in the UHV-CVD system, and it is not applicable to a stabilized mass production.

SUMMARY OF THE INVENTION

It is an object of the present invention to provide a method of manufacturing a flat selective silicon epitaxial thin film free from facets by means of an LPCVD system which does not require an ultrahigh vacuum.

The feature of this invention is the manufacture of a selective silicon epitaxial thin film by introducing raw material gas and atomic hydrogen formed in a formation chamber provided separately from a reaction chamber, into the reaction chamber, while maintaining the growth temperature at a certain level in the range of 750 to 900° C. and the pressure within the reaction chamber at a certain level in the range of 1 0to 30 Torr.

The atomic hydrogen formed in the formation chamber which is separate from the reaction chamber is adsorbed to the surface of silicon when introduced to the reaction chamber, thus reducing the free energy of the silicon surface to a great extent. As a result, the facet formation is suppressed, and the range of the facet-free growth pressure is extended toward the lower pressure side.

Since the loading effect is more suppressed for the lower growth pressure, the range of growth conditions in which neither the loading effect nor the facet formation takes place is widened due to this extension of the facet-free growth pressure range toward the lower pressure side.

Consequently, by employing the method of the present invention, it is possible to stably grow a selective silicon epitaxial thin film in a manner where both of facet formation and loading effect do not occur, using an LPCVD system which, in contrast to a UHV-CVD system, is not expensive and does not require an intricate maintanance operation.

BRIEF DESCRIPTION OF THE DRAWINGS

The above and other objects, advantages, and features of the present invention will be more apparent from the following description taken in conjunction with the accompanying drawings, in which:

FIGS. 3(a) and (b) are diagrams illustrating the definitions of the film thicknesses for describing the effect of the first embodiment of this invention;

FIG. 4 is a graph showing the dependence of the normalized film thicknesses on the side length of the opening for describing the effect of the first embodiment of this invention.

DESCRIPTION OF THE PREFERRED EMBODIMENTS

Figure 1:
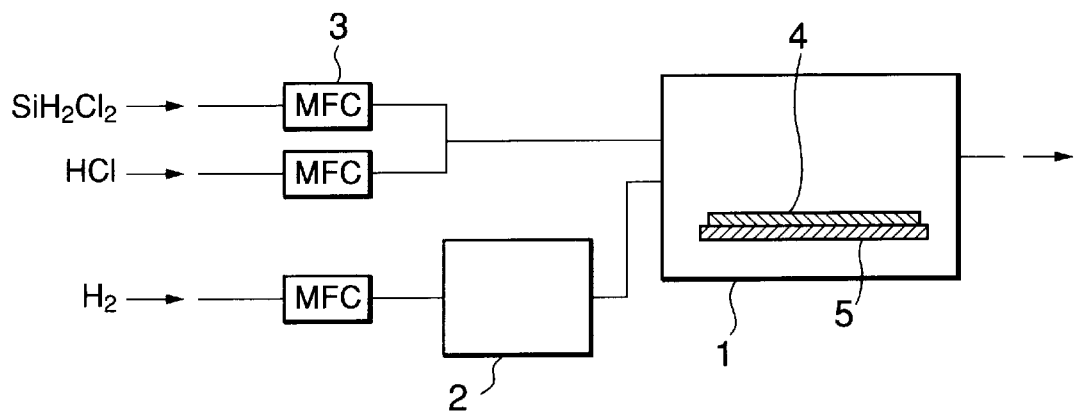
FIG. 1 is a block diagram of a selective silicon epitaxial growth system employed in a first embodiment of this invention.

Referring to the drawings, a first embodiment of this invention will be described hereafter.

EXAMPLE 1

FIG. 1 is a selective silicon epitaxial growth system used in a first embodiment of this invention. This system consists of an LPCVD system in wide general use to which is added an atomic hydrogen formation chamber 2 for introducing atomic hydrogen to a reaction chamber 1. Dichlorosilane $SiH_2Cl_2$ gas and HCl gas are directly fed into the reaction chamber 1 without going through the atomic hydrogen formation chamber 2 while their flow rates are being controlled by mass flow controllers (MFCs) 3. The flow rate of hydrogen gas, $H_2$, is controlled by MFC 3, and the gas is fed into the reaction chamber 1, with a part of which being converted into atomic hydrogen in the atomic hydrogen formation chamber 2. Using the gases fed into the reaction chamber 1 in this manner, selective silicon epitaxial growth takes place on a silicon substrate 4 placed on a susceptor 5.

In the following, an example of selective silicon epitaxial growth employing this system will be described.

Figure 2A:
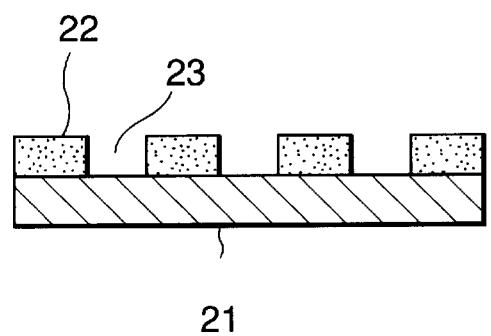
FIGS. 2(a) and (b) are diagrams describing the manufacturing method of the substrate employed in the first and a second embodiments of this invention.
Figure 2B:
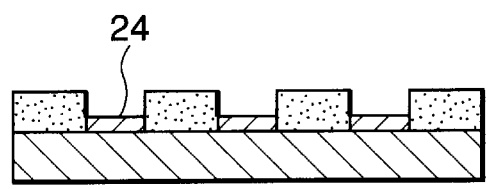

First, as shown in FIG. 2(a), a silicon oxide film 22 is formed to a thickness of 200 nm on the entire surface of a 6-inch diameter silicon substrate 21 which has crystal plane orientation (100), and a square opening pattern 23 is formed by photolithography and etching. In this case, opening patterns of different sizes, namely, 0.5 $\mu$m×0.5 $\mu$m and 2 $\mu$m×2 $\mu$m, are prepared.

In order to remove a native oxide film formed on the substrate surface, the sample is subjected for one minute to an etching using a 0.5% diluted hydrofluoric acid, and after washing with purified water and drying, it is set on a growth apparatus. As a pre-treatment for growth, the substrate is heated to a temperature of 850° C., 20 SLM of $H_2$ gas alone is passed over the substrate, and the pressure of the growth apparatus is maintained at 10 Torr for five minutes. Next, the substrate temperature for the growth of the selective silicon epitaxial film is set at 800° C., $SiH_2Cl_2$ and HCl are fed into the reaction chamber at 100 sccm and 30 sccm, respectively, and 20 SLM of $H_2$ gas is introduced to the reaction chamber through the atomic hydrogen formation chamber. Microwaves (80 W at 2.45 GHz) are employed as the method of formation of atomic hydrogen.

In this manner, a selective silicon epitaxial film is grown to have a thickness of about 50 nm for the square opening parts of 2 $\mu$m×2 $\mu$m size, and the thickness and the shape of the film in the opening parts of different sizes are evaluated. In addition, the case of growth without involving formation of atomic hydrogen (corresponding to the case of growth in the conventional LPCVD system) is also evaluated as reference example 1.

The film thickness 31 at the central part of the epitaxial film, the film thickness 32 at the extreme end parts (parts where the film makes contact with the silicon oxide film), and the maximum film thickness 33, as shown in FIGS. 3(a) and 3(b), are measured to evaluate the extent of occurrence of the facets and the loading effect. Here, FIGS. 3(a) and 3(b) are the schematic diagrams of the cross sections of the epitaxial film for the cases with and without, respectively, the formation of the facets.

Next, the evaluation result of the epitaxial film based on the first embodiment and the reference example 1 will be described. In the case of the reference example 1, facets are formed giving a film structure as illustrated in FIG. 3(a). In contrast, in the first embodiment, a film with extremely flat structure is formed with no facet formation, and an increase in the film thickness at the end parts of the epitaxial film, as shown in FIG. 3(a), does not take place.

As facet formation is involved in the reference example 1, the result in which the epitaxial film is grown under the growth conditions with suppression of formation of the facets will be presented as reference example 2. In the reference example 2, the processes up to the growth pre-treatment are the same as in the first embodiment, and the film growth is carried out by changing only the pressure at the time of growth of the selective silicon epitaxial film to 40 Torr. In the case of the reference example 2, an increase in the film thickness is observed at the end parts of the epitaxial film, as shown in FIG. 3(b), although no facet formation takes place.

FIG. 4 shows the opening size dependence of the film thickness at the extreme end parts (parts where the film makes contact with the silicon oxide film) and the maximum film thickness, normalized to the thickness at the central part of the epitaxial film of the opening of 2 $\mu$m square, for the first embodiment, and the reference examples 1 and 2. Note that in the first embodiment and the reference example 2, facets are not formed, and the maximum thickness is achieved at the end parts of the epitaxial film.

As shown in FIG. 4, in the reference example 1 a decrease in the film thickness at the end parts of the epitaxial film due to facet formation is observed. In the reference example 2, a tendency (loading effect) of having an increased film thickness at the end parts of the epitaxial film with the decrease in the size of the openings is observed, although the facet formation does not take place. As described before, in the growth method using the conventional LPCVD system it is extremely difficult to find growth conditions which can suppress both of the facet formation and the loading effect. Even if such conditions are found, the process will be a very unstable one because of the narrowness of its process window.

On the contrary, the adoption of the first embodiment enables to extend the width of the process window of the growth conditions for suppressing both of the facet formation and the loading effect, and makes it possible to secure the stability of the process. More specifically, in the first embodiment, the desired process stability can be achieved by limiting the growth conditions of various parameters to the following ranges; namely, the substrate temperature to 750–900° C., the $H_2$ gas flow rate to 10–40 SLM, the $SiH_2Cl_2$ flow rate to 70–150 sccm, the HCl flow rate to 10–40 sccm, and the growth pressure to 5–20 Torr.

Although an example which employs microwaves as the method of formation of atomic hydrogen has been mentioned, similar effect can be obtained by adopting another method which uses, for example, irradiation with deep ultraviolet (DUV) rays or tungsten filaments heated to a high temperature.

As described above, according to the first embodiment it is possible to stably manufacture a selective silicon epitaxial film in which the facet formation as well as the loading effect are suppressed.

(Embodiment 2)

Figure 5:
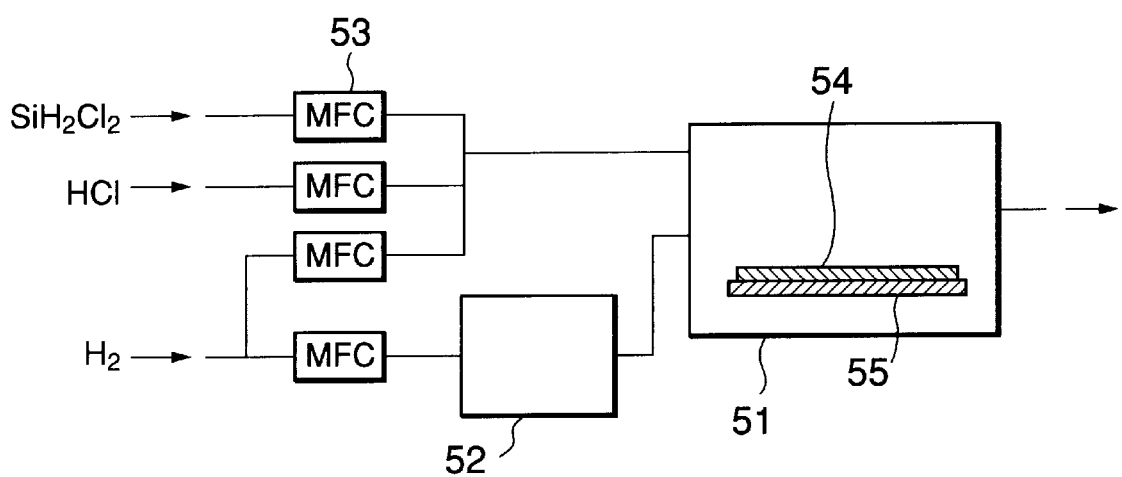
FIG. 5 is a block diagram of a selective silicon epitaxial growth system employed in a second embodiment of this invention.

FIG. 5 shows the selective silicon epitaxial growth system used in a second embodiment of this invention. This system is constituted of the LPCVD system used in the first embodiment to which is added a gas line for directly introducing $H_2$ gas to the reaction chamber 51, provided separately from the gas line for introducing $H_2$ gas to the reaction chamber via an atomic hydrogen formation chamber 52. In short, the difference of the second embodiment from the first embodiment resides in the point that $H_2$ gas is split to pass through two MFCs 53, and one part of which is fed directly into the reaction chamber by being mixed with $SiH_2Cl_2$ and HCl.

In the following, an example of growth of a selective silicon epitaxial film by the use of this system will be described.

First, the processes from the manufacture of a substrate with square opening pattern to the growth preprocessing similar to those of the first embodiment are introduced. Next, growth conditions of a selective silicon epitaxial film, by employing the formation method of hydrogen radicals using microwaves, are experimentally varied in order to determine the ranges of conditions which can suppress the facet formation and the loading effect.

Although the second embodiment incurs a cost rise in comparison to the first embodiment due to the addition of the $H_2$ gas line, the following advantages in the ranges of the growth conditions are achieved. Namely, in the first embodiment, growth of the selective silicon epitaxial film suppressing both of the facet formation and the loading effect is realized by limiting various quantities to the following ranges; the substrate temperature to 900° C., the $H_2$ gas flow rate to 10–40 SLM, the $SiH_2Cl_2$ gas flow rate to 70–150 sccm, the HCl gas flow rate to 10–40 sccm, and the growth pressure to 5–20 Torr. In the second embodiment, it is possible to extend these ranges to the following levels; the substrate temperature to 750–900° C., the $H_2$ gas flow rate to 5–50 SLM, the $SiH_2Cl_2$ gas flow rate to 50–200 sccm, the HCl gas flow rate to 10–50 sccm, and the growth pressure to 1–30 Torr. What is important here is the distribution ratio of the $H_2$ gas where it is necessary to regulate the flow rate of the $H_2$ gas to be introduced to the atomic hydrogen formation chamber 52 to be in the range of 1–10% of the total amount of the $H_2$ gas. If the level is below this range, the generated amount of the hydrogen radicals is small whereas if it is above the range, the effect of splitting the flow into two parts is lost.

Here, the effect of splitting the $H_2$ gas flow into two systems will be described. In the first embodiment, the formation efficiency of atomic hydrogen is reduced because the inflow of $H_2$ gas (flow rate) into the atomic hydrogen formation chamber is too large compared to an ability of atomic hydrogen formation. In view of this, by introducing only a part of the $H_2$ gas into the atomic hydrogen formation chamber as in the second embodiment, it is possible to form atomic hydrogen with high efficiency. On the other hand, if the flow rate of the $H_2$ gas is reduced in the first embodiment, it results in the impairment of its intrinsic role as a carrier gas.

Although an example of using microwaves has been described in the second embodiment as a formation method of atomic hydrogen, similar effects can be obtained by employing another method which uses, for example, irradiation with DUV rays or filaments heated to a high temperature.

In this way, according to the second embodiment it is possible to stably grow a selective silicon epitaxial film in which the facet formation and the loading effect are suppressed.

As described in the above, the present invention has the following effect. Namely, a selective silicon epitaxial film can be grown at a temperature within the range of 750 to 900° C. while maintaining the pressure in the reaction chamber at a certain pressure in the range of 1 to 30 Torr by introducing atomic hydrogen formed in the formation chamber installed separately from the reaction number into the reaction chamber. With this arrangement, the present invention has an effect of stably manufacturing a selective silicon epitaxial film of flat shape free from the facet formation and the loading effect by using an LPCVD system which does not require an ultrahigh vacuum.

While this invention has been described in connection with certain preferred embodiments, it is to be understood that the subject matter encompassed by way of this invention is not to be limited to these specific embodiments. On the contrary, it is intended for the subject matter of the invention to include all alternative modifications and equivalents as can be included within the spirit and scope of the following claims.

What is claimed is:

1. A method of selective silicon epitaxial film growth, characterized in that dichlorosilane, hydrogen chloride and hydrogen gas including atomic hydrogen are introduced into a reaction chamber at a growth temperature in the range of 750 to 900° C. while the pressure in said reaction chamber is maintained within the range of 1 to 30 Torr.

2. The method of selective silicon epitaxial film growth as claimed in claim 1, wherein a gas flow rate of said dichlorosilane supplied to said reaction chamber is in the range of 70 to 150 sccm, a gas flow rate of said hydrogen chloride supplied to said reaction chamber is in the range of 10 to 40 sccm, a gas flow rate of said hydrogen gas including atomic hydrogen supplied to said reaction chamber is in the range of 10 to 40 SLM, and the pressure within said reaction chamber is set to be in the range of 5 to 20 Torr.

3. The method of selective silicon epitaxial film growth as claimed in claim 1, wherein said atomic hydrogen is introduced into the reaction chamber after being formed in an atomic hydrogen formation chamber provided separately from the reaction chamber.

4. The method of selective silicon epitaxial film growth as claimed in claim 3, wherein said atomic hydrogen is formed by plasma discharge of hydrogen gas using microwaves or high frequency radio waves.

5. The method of selective silicon epitaxial film growth as claimed in claim 3, wherein said atomic hydrogen is formed by irradiating hydrogen gas with ultraviolet rays.

6. The method of selective silicon epitaxial film growth as claimed in claim 2, wherein said atomic hydrogen is formed by bringing hydrogen gas into contact with filaments heated at a high temperature.

7. A method of selective silicon epitaxial film growth comprising:

supplying dichlorosilane and hydrogen chloride into a reaction chamber;

supplying hydrogen gas into said reaction chamber and an atomic hydrogen formation chamber connected outside said reaction chamber;

generating atomic hydrogen in said atomic hydrogen formation chamber; and supplying said atomic hydrogen into said reaction chamber, wherein said reaction chamber is at a growth temperature in the range of 750 to 900° C. while the pressure in said reaction chamber is in the range of 1 to 30 Torr, and a gas flow rate of said hydrogen gas supplied to said atomic hydrogen formation chamber is in the range of 1 to 10% of a total gas flow rate of said hydrogen gas supplied to said reaction chamber and said atomic hydrogen formation chamber.

8. The method of selective silicon epitaxial film growth as claimed in claim 7, wherein a gas flow rate of said dichlorosilane supplied to said reaction chamber is in the range of 50 to 200 sccm, a gas flow rate of said hydrogen chloride supplied to said reaction chamber is in the range of 10 to 50 sccm, and a total gas flow rate of said hydrogen gas supplied to said reaction chamber and said atomic hydrogen formation chamber is in the range of 5 to 50 SLM.

* * * * *